(12) United States Patent
Hsiao et al.

(10) Patent No.: US 8,735,255 B2
(45) Date of Patent: May 27, 2014

(54) METHOD OF MANUFACTURING SEMICONDUCTOR DEVICE

(75) Inventors: Wen Chu Hsiao, Tainan (TW); Lai Wan Chong, Kaohsiung (TW); Chun-Chieh Wang, Kaohsiung (TW); Ying Min Chou, Tainan (TW); Hsiang Hsiang Ko, Sinying (TW); Ying-Lang Wang, Tien-Chung Village (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/461,532

(22) Filed: May 1, 2012

(65) Prior Publication Data

US 2013/0295739 A1    Nov. 7, 2013

(51) Int. Cl.
*H01L 21/336* (2006.01)

(52) U.S. Cl.
USPC .................................. 438/300; 257/E21.431

(58) Field of Classification Search
USPC ................ 438/429, 938; 257/E21.42, E21.44
See application file for complete search history.

(56) References Cited

U.S. PATENT DOCUMENTS

| 7,943,969 B2 * | 5/2011 | Yang et al. ............ 257/E21.619 |
| 8,148,750 B2 * | 4/2012 | Pal et al. ........................ 257/190 |

* cited by examiner

*Primary Examiner* — Chandra Chaudhari
(74) *Attorney, Agent, or Firm* — Lowe Hauptman & Ham, LLP

(57) ABSTRACT

In a method of manufacturing a semiconductor device, a source/drain feature is formed over a substrate. A Si-containing layer is formed over the source/drain feature. A metal layer is formed over the Si-containing layer. A metal silicide layer is formed from the metal layer and Si in the Si-containing layer.

20 Claims, 8 Drawing Sheets

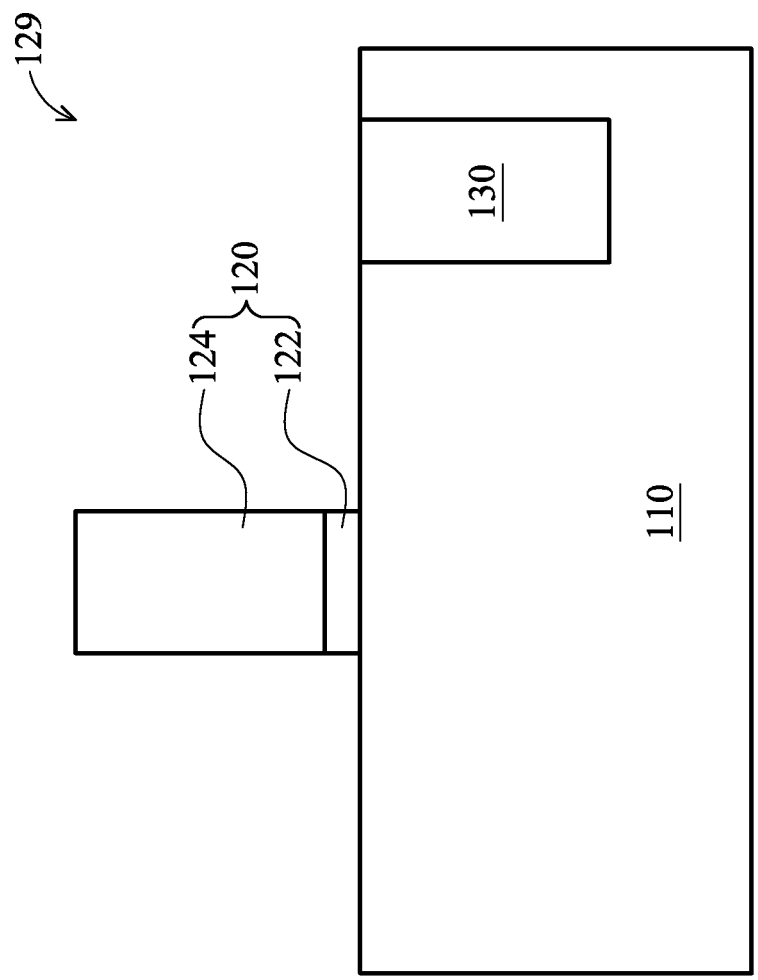

METHOD OF MANUFACTURING SEMICONDUCTOR DEVICE

BACKGROUND

The recent trend in miniaturizing integrated circuits (ICs) has resulted in smaller devices which consume less power, yet provide more functionally at higher speeds than before. The miniaturization process at advanced process nodes has also posed numerous technical challenges rarely observed at low process nodes.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 1A-1G are schematic cross-sectional views of a semiconductor device in various manufacturing operations in accordance with some embodiments.

DETAILED DESCRIPTION

Figure 1B:
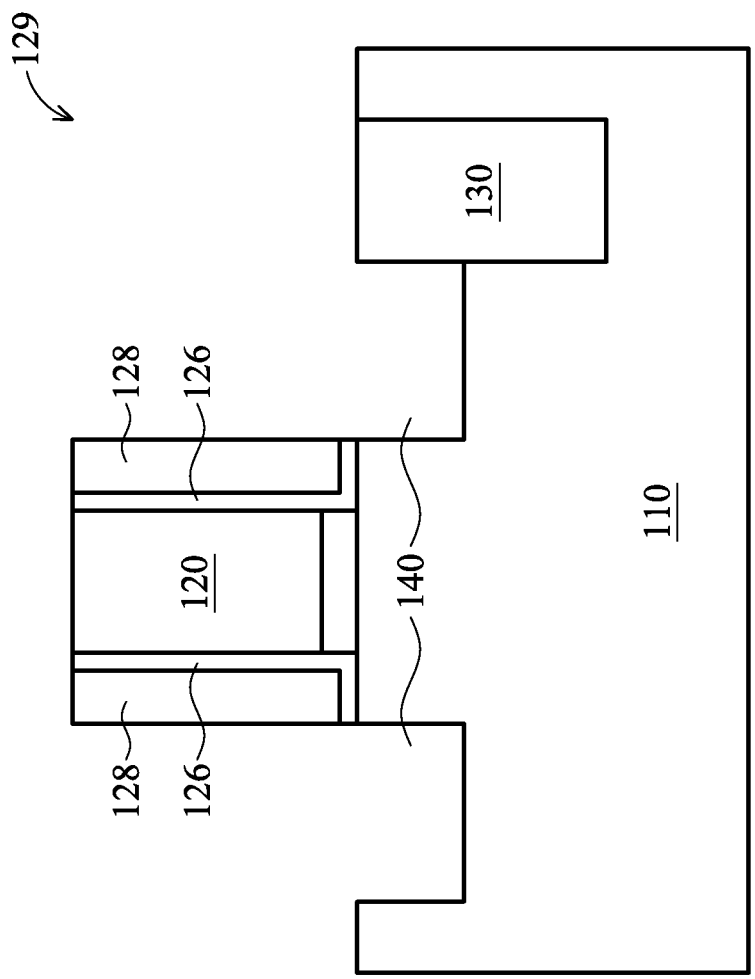

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

The drawings are not drawn to scale, and include certain features that are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

In some embodiments, a Si-containing layer is formed over a source/drain feature before performing a silicidation process. The Si-containing layer reacts with a metal layer during the silicidation process to form a metal silicide layer.

FIGS. 1A-1G are schematic cross-sectional views of a semiconductor device 100 at various manufacturing stages in accordance with some embodiments. In one or more embodiments, the semiconductor device 100 comprises active components such as field effect transistors (FET), complementary metal-oxide-semiconductor (CMOS) transistors, metal-oxide-semiconductor field effect transistors (MOSFETs), high voltage transistors, high frequency transistors, and combinations thereof. In one or more embodiments, the semiconductor device 100 comprises passive components, such as resistors, capacitors, inductors, and fuses. In the description below, one or more methods of manufacturing a p-channel metal-oxide semiconductor (PMOS) device and/or an n-channel metal-oxide semiconductor (NMOS) device will be described. However, further embodiments are applicable to other types of semiconductor devices or components, especially where a metal silicide layer is to be formed.

In the operation in FIG. 1A, a substrate 110 is formed with a gate stack 120 and an isolation feature 130. In some embodiments, the substrate 110 comprises an elementary semiconductor, a compound semiconductor, an alloy semiconductor, or combinations thereof. Examples of the elementary semiconductor include, but are not limited to, silicon and germanium. Examples of a compound semiconductor include, but are not limited to, silicon carbide, gallium arsenic, gallium phosphide, indium phosphide, indium arsenide, and indium antimonide. Examples of the alloy semiconductor include, but are not limited to, SiGe, GaAsP, AlInAs, AlGaAs, GaInAs, GaInP, and GaInAsP. Other semiconductor materials including group III, group IV, and group V elements are used in some embodiments. In one or more embodiments, the substrate 110 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type.

In some embodiments, the substrate 110 comprises one or more doped regions. A p-type doped region comprises p-type dopants, such as boron or BF2. An n-type doped region comprises n-type dopants, such as phosphorus or arsenic. In one or more embodiments, doped regions are formed directly on the substrate 110, in a P-well structure, a N-well structure, a dual-well structure, or a raised structure. In one or more embodiments, PMOS devices and NMOS devices are formed in different device regions with corresponding doped regions. The isolation feature 130 is formed in the substrate 110 to isolate various regions of the substrate 110, such as device regions for PMOS devices from device regions for NMOS devices.

The gate stack 120 comprises a gate dielectric layer 122 and a gate electrode 124. Other layers are included in some embodiments. The gate stack 120 is formed by chemical vapor deposition (CVD), physical vapor deposition (PVD), atomic layer deposition (ALD), high density plasma CVD (HDPCVD), plating, other suitable methods, or combinations thereof.

The gate dielectric layer 122 is formed over the substrate 110 and comprises a dielectric material, a high-k dielectric material, other suitable dielectric material, or combinations thereof. Examples of a dielectric material include, but are not limited to, silicon oxide, silicon oxynitride, silicon nitride, or combinations thereof. Examples of high-k dielectric materials include, but are not limited to, $HfO_2$, HfSiO, HfSiON, HfTaO, HfTiO, HfZrO, or combinations thereof. In some embodiments, the gate dielectric layer 122 comprises a multilayer structure. For example, the gate dielectric layer 122 comprises an interfacial layer, and a high-k dielectric material layer formed on the interfacial layer. An exemplary interfacial layer is a grown silicon oxide layer formed by a thermal process or ALD process.

The gate electrode 124 is formed over the gate dielectric layer 122. In one or more embodiments, the gate electrode 124 is a polycrystalline silicon (polysilicon) layer. In one or more embodiments, the polysilicon layer is doped for proper conductivity, e.g., in a gate-first process. In one or more embodiments, the polysilicon is not necessarily doped where it is a dummy gate to be replaced in a subsequent gate replacement (gate last) process. In one or more embodiments, the gate electrode 124 comprises a conductive layer having a proper work function. For example, a p-type work function metal (p-metal) comprises TiN and/or TaN, whereas an n-type work function metal (n-metal) comprises Ta, TiAl, TiAlN, and/or TaCN. In one or more embodiments, the work function layer comprises doped conducting oxide materials.

In one or more embodiments, the gate electrode 124 comprises other conductive materials, such as aluminum, copper, tungsten, metal alloys, metal silicide, other suitable materials, or combinations thereof. For example, where the gate electrode 124 comprises a work function layer, another conductive layer is formed over the work function layer.

In some embodiments, a hard mask layer is formed over the gate electrode 124 to function as an etch mask, and/or to protect the underlying layers from damage during subsequent processing. In one or more embodiments, such hard mask layer comprises silicon oxide, silicon nitride, silicon oxynitride, silicon carbide, or combinations thereof.

The isolation feature 130 is formed at least partially in the substrate 110. In some embodiments, the isolation feature 130 is a raised structure partially located outside the substrate 110. The isolation feature 130 utilizes isolation technology, such as local oxidation of silicon (LOCOS) and/or shallow trench isolation (STI), to define and electrically isolate various regions. The isolation feature 130 comprises silicon oxide, silicon nitride, silicon oxynitride, other suitable materials, or combinations thereof. The isolation feature 130 is formed by any suitable process. In one example, the formation of an STI comprises a photolithography process, etching a trench in the substrate, and filling the trench (for example, by using a CVD process) with one or more dielectric materials. In one or more embodiments, the filled trench has a multi-layer structure, such as a thermal oxide liner layer filled with silicon nitride or silicon oxide.

In some embodiments, an etching process is performed to remove an upper portion of the substrate 110, to ensure that bottom portions of the gate stack 120 will be fully protected by subsequently formed spacers. In some embodiments, regions of the substrate 110 outside the gate stack 120 and isolation feature 130 are doped with dopants to be lightly doped source/drain (LDD) regions. The dopants are selected depending on the type of the devices to be formed in the LDD regions. For example, LDD regions for forming NMOS devices are doped with an n-type dopant, such as phosphorous or arsenic, and LDD regions for forming PMOS devices are doped with a p-type dopant, such as boron or BF2.

In the operation in FIG. 1B, a liner 126 and dummy spacers 128 are formed on sidewalls of the gate stack 120 to define a gate structure 129. In some embodiments, the dummy spacers 128 are formed on the sidewalls of the gate stack 120 without the liner 126 which is to be formed at a later operation. The liner 126 comprises an oxide material, such as silicon oxide and/or another suitable dielectric material. The dummy spacers 128 comprise a nitride material, such as silicon nitride, silicon oxide, silicon oxynitride, or combinations thereof. In some embodiments, the liner 126 and dummy spacers 128 are formed by blanket depositing a first dielectric layer for defining the liner 126 over the substrate 110 (including the gate stack 120) and a second dielectric layer for defining the dummy spacers 128 over the first dielectric layer. The dielectric layers are then anisotropically etched to form the liner 126 and dummy spacers 128.

An etching process is performed to remove portions of the substrate 110 outside the gate structure 129 and the isolation feature 130 to form recesses 140 in the substrate 110. In some embodiments, the recesses 140 are formed in previously formed LDD regions. The etching process comprises a dry etching process, a wet etching process, or combinations thereof.

Figure 1C:
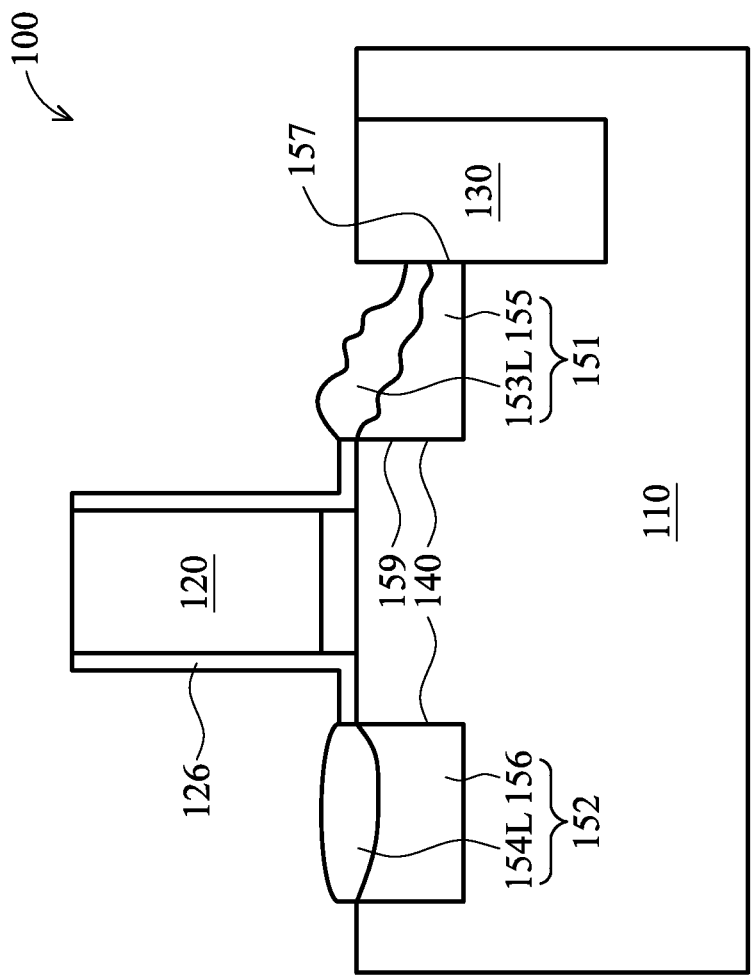

In the operation in FIG. 1C, a semiconductor material is deposited in the recesses 140 to form source/drain features 151, 152. One of the source/drain features 151, 152 defines a source region for the NMOS or PMOS device being manufactured, and the other of the source/drain features 151, 152 defines a drain region for the NMOS or PMOS device being manufactured. In one or more embodiments, an epitaxial process (epitaxy) is performed to deposit the semiconductor material in the recesses 140. Examples of the epitaxial process include, but are not limited to, a selective epitaxy growth (SEG) process, CVD deposition techniques (e.g., vapor-phase epitaxy (VPE) and/or ultra-high vacuum CVD (UHV-CVD)), molecular beam epitaxy, other suitable epitaxial processes, or combinations thereof. In one or more embodiments, the epitaxial process uses gaseous and/or liquid precursors, which interact with the composition of the substrate 110.

In one or more embodiments, the semiconductor material deposited in the recesses 140 comprises an appropriate stressor for enhancing charge carrier mobility of the device being manufactured. For example, for a PMOS device, the stressor is configured to apply a compressive stress to enhance hole mobility. For an NMOS device, the stressor is configured to apply a tensile stress to enhance electron mobility. Examples of the stressor material include, but are not limited to, SiGe, SiC, GeSn, SiGeSn, and other suitable materials. In some embodiments described in detail herein below, the semiconductor material deposited in the recesses 140 comprises epitaxially grown SiGe. Similar descriptions are applicable to other stressor materials in further embodiments.

In one or more embodiments, the source/drain features 151, 152 made of SiGe include an upper portion having a lower concentration of Ge and a lower portion having a higher concentration of Ge. For example, the source/drain feature 151 includes an upper portion 152 having a lower concentration of Ge and a lower portion 153 having a higher concentration of Ge. Likewise, the source/drain feature 152 includes an upper portion 154 having a lower concentration of Ge and a lower portion 156 having a higher concentration of Ge. The upper portion 153 or 154 includes a lower concentration of Ge, and hence a higher concentration of Si, than the corresponding lower portion 155 or 156. On the one hand, the upper portion 153 or 154 with the higher concentration of Si is configured to form a silicide layer in a subsequent silicidation process and/or to provide appropriate etch selectivity in a subsequent contact etch operation. On the other hand, the lower portion 155, 156 with the higher concentration of Ge is configured to provide appropriate stress, such as a tensile stress for an NMOS device or a compressive stress for a PMOS device.

In one or more embodiments, the source/drain feature 151, which is adjacent the isolation feature 130, is formed with a non-uniform thickness that is decreased from the gate stack 120 toward the isolation feature 130. Specifically, the source/drain feature 151 includes a first side 157 and a second side 159. The first side 157 of the source/drain features 151, 152 contacts the isolation feature 130. The second side 159 is father from the isolation feature 130 than the first side 157, and is adjacent the gate stack 120. The source/drain feature 151 has a greater thickness at the second side 159 than at the first side 157. The source/drain feature 151 is slanted downwardly from the second side 159 to the first side 157. This situation is observed when the material of the source/drain feature 151 does not adhere well to the material of the isolation feature 130. For example, when the source/drain feature 151 is made of SiGe which does not adhere well to $SiO_2$ of the isolation feature 130, the source/drain feature 151 has a decreasing thickness and is slanted downwardly from the gate stack 120 to the isolation feature 130.

The source/drain feature 152 which is not adjacent the isolation feature 130, is formed with a thickness which is more uniform than that of the source/drain feature 151. The thickness of the source/drain feature 152 at opposite sides thereof is about the same. In one or more embodiments, the source/drain feature 152 is formed as a raised structure projecting upwardly from the substrate 110.

In one or more embodiments, the source/drain features 151, 152 are doped by an ion implantation process, a plasma immersion ion implantation (PIII) process, a gas and/or solid source diffusion process, other suitable process, or combinations thereof. In one or more embodiments, the source/drain features 151, 152 are further exposed to annealing processes, such as a rapid thermal annealing (RTA) process.

In one or more embodiments, the dummy spacers 128 are removed after the formation of the source/drain features 151, 152. For example, the dummy spacers 128 are removed by a wet etching using phosphoric acid or hydrofluoric acid, or by a dry etching using a suitable etchant. In one or more embodiments in which the liner 126 is not previously formed in the operation described with respect to FIG. 1B, the liner 126 is formed after the removal of the dummy spacers 128 to protect the sidewalls of the gate stack 120 from damage during subsequent operations. In one or more embodiments, the dummy spacers 128 are not removed, and main spacers are subsequently formed over the dummy spacers 128. The removal of the dummy spacers 128 and/or the formation of the liner 126 (which includes material layer deposition and etching in one or more embodiments) are likely to result in a loss of a thickness of the upper portions 153 and 154.

Figure 1D:
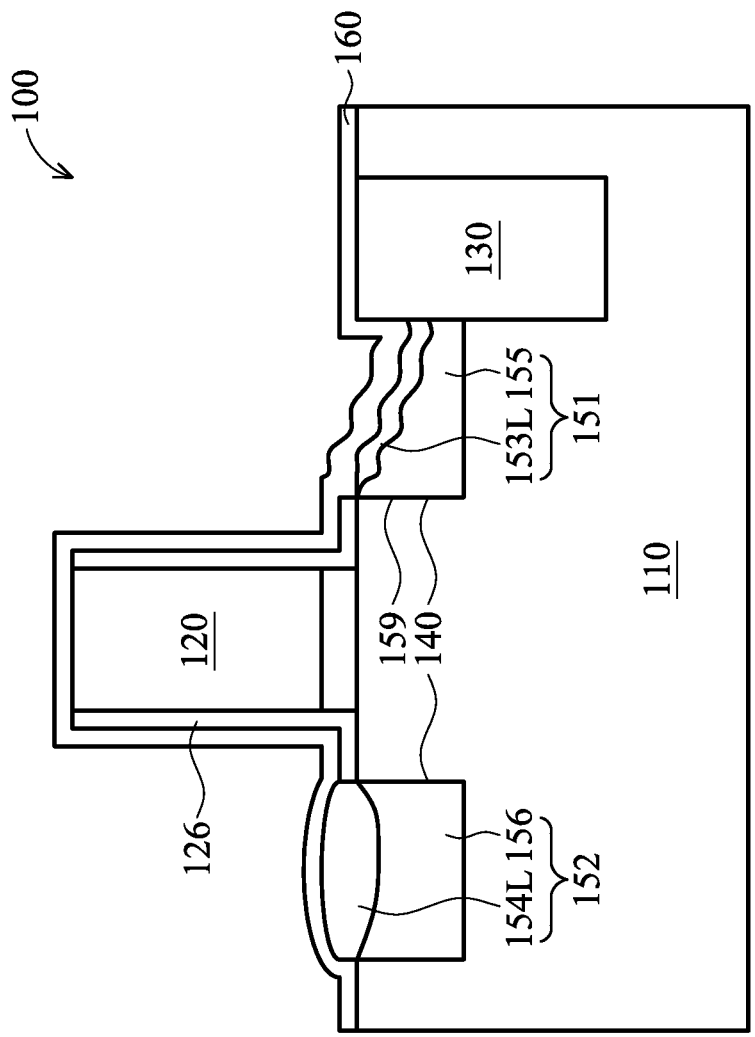

In the operation in FIG. 1D, a stress memorization technology (SMT) layer 160 is formed over the substrate 110 to provide the source/drain features 151, 152 with a predetermined stress, i.e., a tensile stress or a compressive stress depending on the type of the MOS device being manufactured. In one or more embodiments, the SMT layer 160 is blanket deposited over the substrate 110, including the gate stack 120, the isolation feature 130, and the source/drain features 151, 152. Examples of materials for the SMT layer 160 include, but are not limited to, nitrides, oxides, oxynitrides, tetra ethyl ortho silicate (TEOS), other suitable materials, or combinations thereof. Examples of methods for forming the SMT layer 160 include, but are not limited to, PECVD and LPCVD.

In one or more embodiments, the substrate 110 with the SMT layer 160 formed thereon is subject to an annealing process. Examples of an annealing process include, but are not limited to, RTA, furnace annealing, flashing annealing, laser annealing, and other suitable processes. During the annealing process, stress is transferred from the SMT layer 160 to the underlying structure including the stressors, i.e., the source/drain features 151, 152. As a result, after a subsequent removal of the SMT layer 160, the stress is still retained, i.e., memorized, by the source/drain features 151, 152, thereby enhancing carrier mobility and performance of the device being manufactured.

Figure 1E:
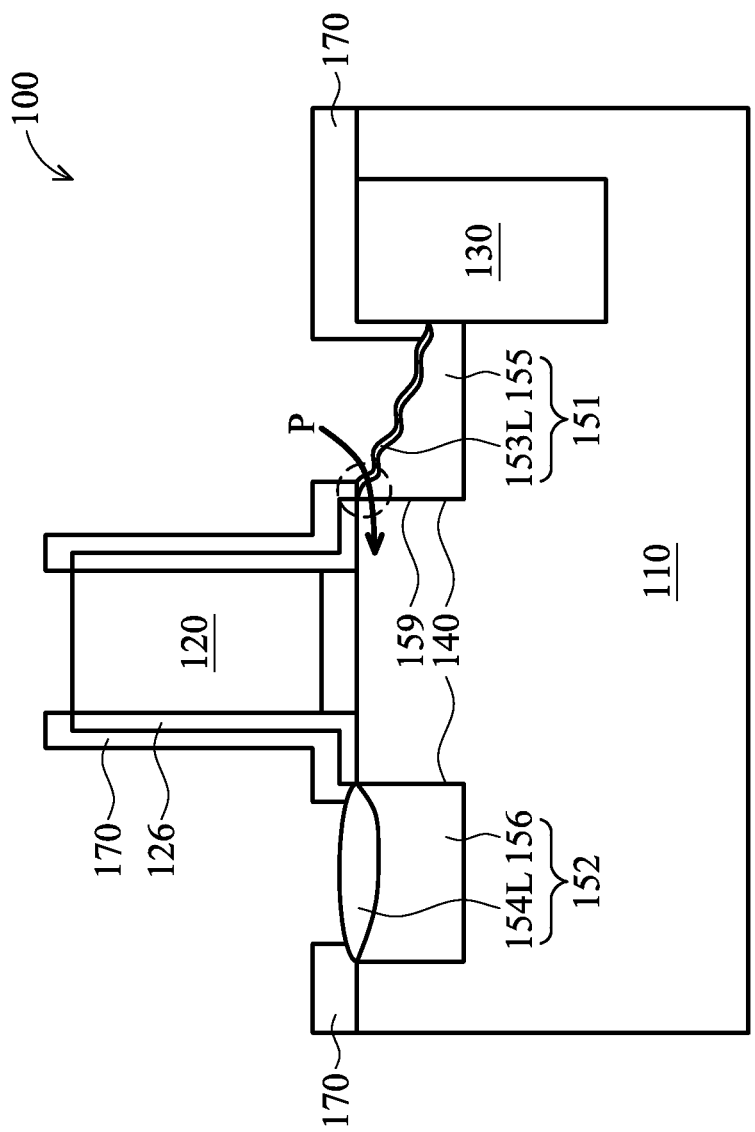

In the operation in FIG. 1E, the SMT layer 160 is removed. For example, the SMT layer 160 is removed by a wet etching or a dry etching. A resist protection oxide (RPO) layer 170 is formed over the substrate 110. Examples of materials for the RPO layer 170 include, but are not limited to, silicon dioxide, silicon nitride, silicon oxy-nitride, oxygen-doped silicon nitride, nitrided oxides, other suitable materials, or combinations thereof. The RPO layer 170 is patterned to expose silicide regions in which a silicidation process is to be performed. In one or more embodiments, the source/drain features 151, 152 are exposed through the patterned RPO layer 170. In one or more embodiments, the top portion of the gate stack 120 is also exposed through the patterned RPO layer 170. In one or more embodiments, the patterning of the RPO layer 170 includes a wet etching, a dry etching, a plasma etching, or combinations thereof. The removal of the SMT layer 160 and/or the patterning of the RPO layer 170 are likely to result in a further loss of an already thinned thickness of the upper portions 153 and 154.

A silicidation process is to be performed on the exposed silicide regions in order to reduce contact resistance. For example, such a silicidation process is performed by depositing a metal layer over the substrate, performing an annealing process to cause metal atoms in the metal layer to react with silicon atoms in the exposed silicide regions to form a metal silicide, and then removing non-reacted portions of the metal layer. However, in some situations, the upper portions 153, 154 of the source/drain features 151, 152, which are intended to react with an overlying metal layer to form metal silicide, are lost (removed) partially or wholly as a result of numerous operations between the formation of the source/drain features 151, 152 and the silicidation process. The thickness of the upper portions 153, 154 in particular, and the thickness of the source/drain features 151, 152 in overall, become zero or too thin, especially in an upper portion 171 of the source/drain feature 151 on the second side 159 thereof. If a silicidation process is directly performed over the upper portion 171 of the source/drain feature 151, the metal atoms are likely to penetrate the upper portion 171 of the source/drain feature 151 to react with Si atoms of the substrate 110. This "piping" defect, schematically designated at arrow P, is further likely to cause current leakage. Further, the thinned or zero thickness of the upper portions 153, 154 of the source/drain features 151, 152 reduces etch selectivity of the source/drain features 151, 152 which, in turn, is likely to result in contact-etch-through defects.

Figure 1F:
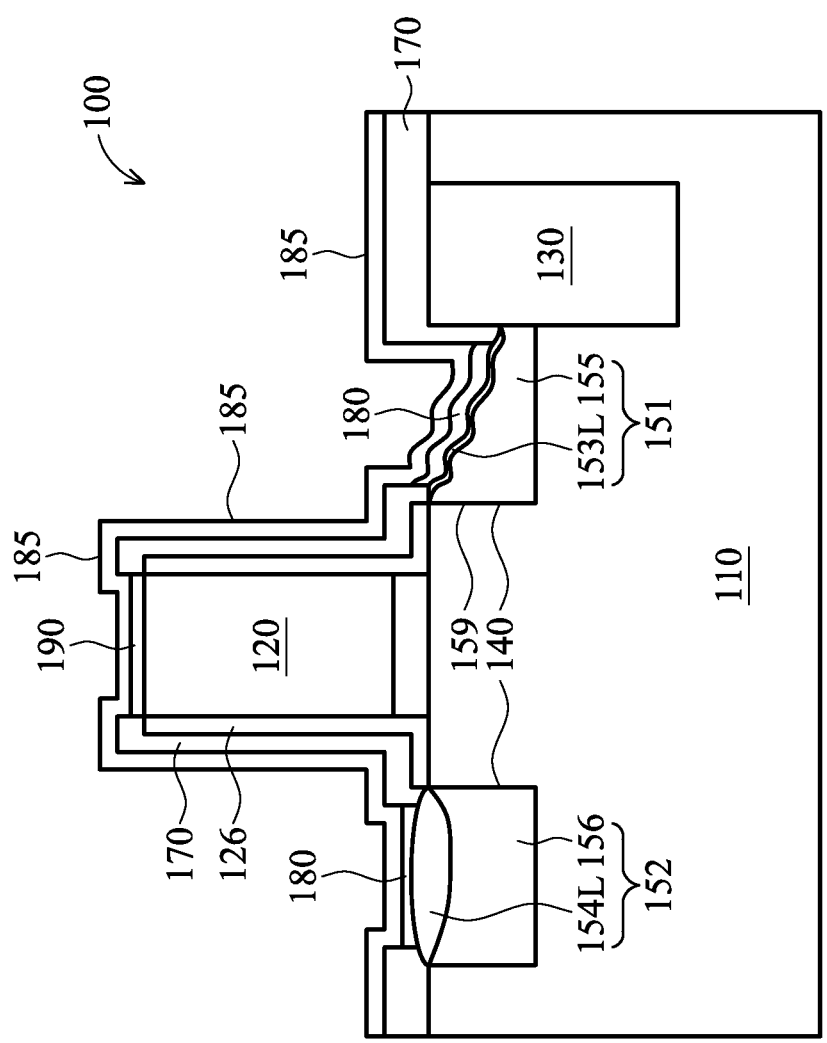

In the operation in FIG. 1F, before performing a silicidation process, a Si-containing layer 180 is formed over the thinned source/drain features 151, 152. Over the source/drain feature 151, the Si-containing layer 180 follows the shape of the source/drain feature 151 and is slanted downwardly from the second side 159 toward the first side 157 of the source/drain feature 151, i.e., from the gate stack 120 toward the isolation feature 130. In one or more embodiments, the Si-containing layer 180 includes a Si layer selectively grown over the source/drain features 151, 152, e.g., by LPCVD. Other materials for the Si-containing layer 180 include, but are not limited to, SiC; GeSn; SiGeSn and other suitable materials.

Figure 1G:
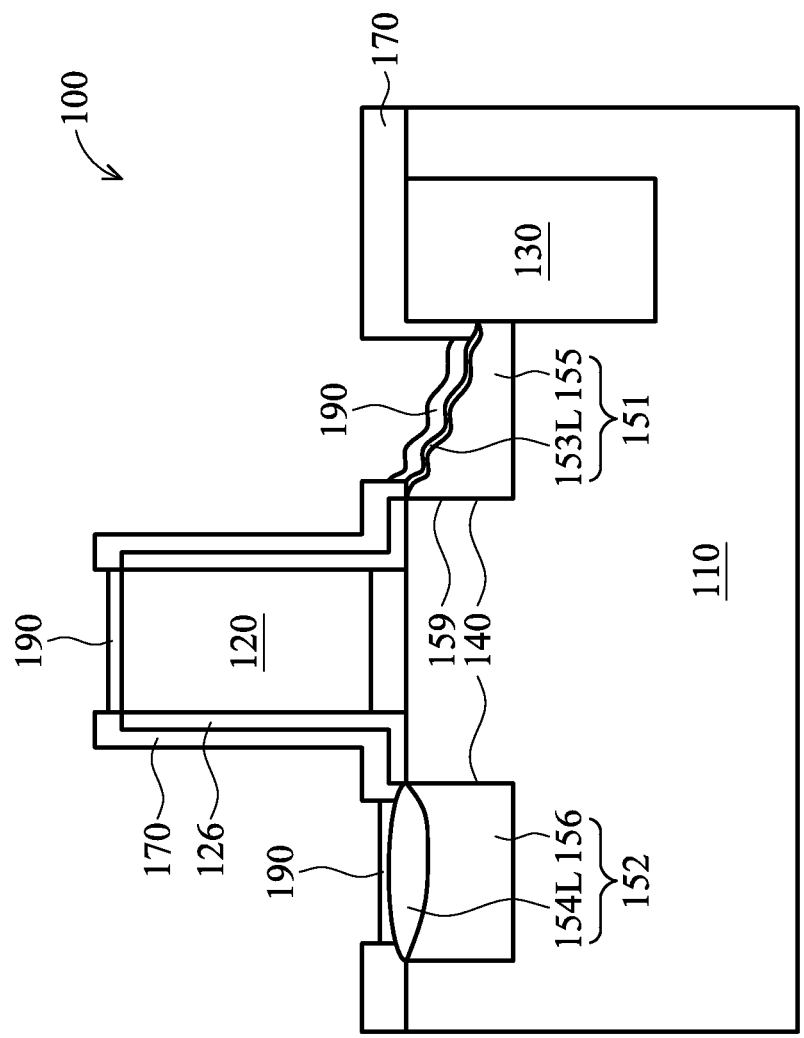

After the formation of the Si-containing layer 180, a metal layer 185 is formed over the substrate 110, and covers the Si-containing layer 180. An annealing process is then performed to cause metal atoms in the metal layer 185 to react with Si atoms in the Si-containing layer 180 to form a metal silicide layer 190 as shown in FIG. 1G. Un-reacted portions of the metal layer 185, which do not overlie the source/drain features 151, 152, are selectively removed, e.g., via a wet etching. In one or more embodiments, the metal layer includes at least one of Pt, W, Ni, Ti, or Co deposited, e.g., by PVD.

In some embodiments, the Si-containing layer 180 and metal layer 185 are also formed over the gate stack 120. As a result, the metal silicide layer 190 is also formed over the gate stack 120, thereby improving the gate electrode contact resistance. In one or more embodiments, the Si-containing layer 180 is completely consumed during the silicidation process. In one or more embodiments, the Si-containing layer 180 is partially consumed during the silicidation process.

In one or more embodiments, the Si-containing layer 180 is configured to prevent metal atoms in the metal layer 185 from penetrating the source/drain features 151, 152 to react with Si atoms in the substrate 110. For example, the Si-containing layer 180 is a selectively grown Si layer having a thickness from 10 to 20 nm. Because metal atoms in the metal layer 185 are prevented from penetrating the source/drain features 151, 152 to react with Si atoms in the substrate 110, piping defects are reduced or prevented even in regions where the thickness of the source/drain features 151, 152 in overall and/or the thickness of the upper portions 153, 154 of the source/drain features 151, 152 in particular are low. For example, piping defects are reduced or prevented in at least the upper portion 171 of the source/drain feature 151.

Further, Si atoms of the Si-containing layer 180 replenish those that were lost (removed) from the upper portions 153, 154 of the source/drain features 151, 152 during various operations prior to the silicidation process. As a result, the metal silicide layer 190 of sufficient quality is formed to both enhance the device performance and to prevent or at least minimize a likelihood of contact-etch-through defects which, in turn, increases the production yield.

In some embodiments, further operations are performed after the silicidation process. For example, the RPO layer 170 is removed and main spacers are formed on the sidewalls of the gate stack 120. In one or more embodiments, the main spacers are formed by blanket depositing a dielectric layer over the substrate 110, and then, anisotropically etching the dielectric layer to form the main spacers. The spacers 252 are positioned on the sidewalls of the gate structures 220 and 221, and in the depicted embodiment, adjacent the dummy spacers 128. The main spacers comprise a dielectric material, such as silicon nitride, silicon oxide, silicon oxynitride, other suitable materials, or combinations thereof. In one or more embodiments, the RPO layer 170 is maintained partially or wholly.

In some embodiments, a contact etch stop layer (CESL) is formed over a top surface of the gate stack 120. Then, an inter-level dielectric (ILD) layer is formed over the substrate 110. A chemical mechanical polishing (CMP) process is performed to planarize the substrate. Contact vias are formed through the ILD layer to contact with the gate stack 120 and the source/drain features 151, 152 via the metal silicide layer 190. Contact-etch-through defects are unlikely to occur for the reasons discussed above. A multilayer interconnection (MLI) including metal layers and inter-metal dielectric (IMD) layers is formed over the substrate 110 to electrically connect the contact vias with various features or structures of the semiconductor device.

In one or more embodiments implementing the gate first approach, the gate electrode 124 remains in the final device. In one or more embodiments implementing the gate last approach, the polysilicon of the gate electrode 124 is removed and replaced with a metal.

Figure 2:
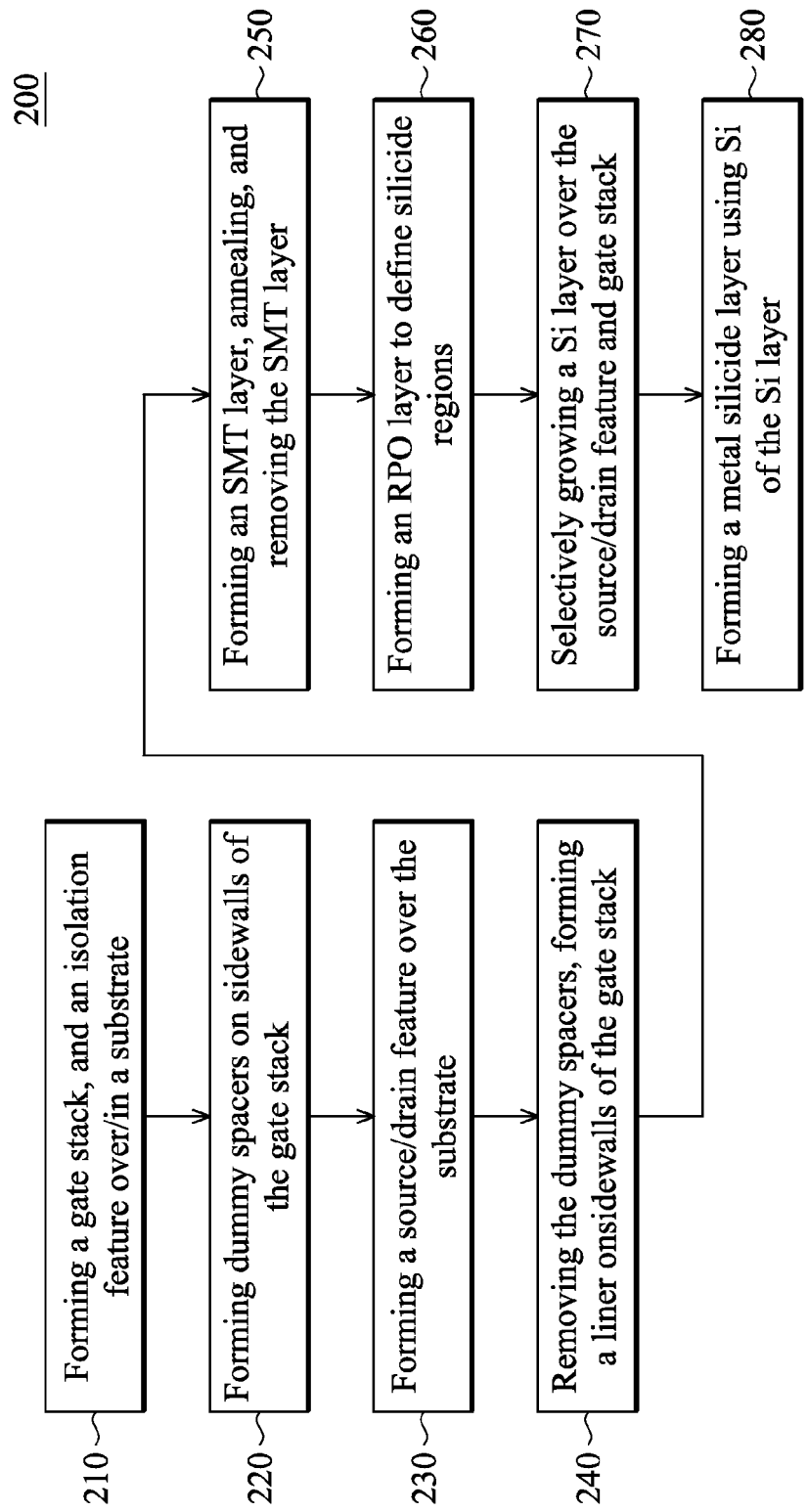
FIG. 2 is a flow chart of a method of manufacturing a semiconductor device in accordance with some embodiments.

FIG. 2 is a flow chart of a method 200 of manufacturing a semiconductor device in accordance with some embodiments.

At an operation 210, a gate stack and/or an isolation feature is/are over/in a substrate. For example, the gate stack 120 and/or the isolation feature 130 is/are over/in the substrate 110, as described with respect to FIG. 1A.

At an operation 220, dummy spacers are formed on sidewalls of the gate stack. For example, the dummy spacers 128 are formed on the sidewalls of the gate stack 120, as described with respect to FIG. 1B.

At an operation 230, a source/drain feature is formed over the substrate. For example, the source/drain feature 151 is formed over the substrate 110, as described with respect to FIG. 1C.

At an operation 240, the dummy spacers are removed and, a liner is formed on the sidewalls of the gate stack. For example, the dummy spacers 128 are removed, and the liner 126 is formed on the sidewalls of the gate stack 120, as described with respect to FIG. 1C.

At an operation 250, an SMT layer is formed over the substrate, annealed, and then removed. For example, the SMT layer 160 is formed over the substrate 110, annealed, and then removed, as described with respect to FIG. 1D.

At an operation 260, an RPO layer is formed over the substrate to define silicide regions. For example, the RPO layer 170 is formed over the substrate 110 to define silicide regions, i.e., the source/drain features 151, 152 and the top of the gate stack 120, as described with respect to FIG. 1E.

At an operation 270, a Si layer is selectively grown over the source/drain feature and gate stack. For example, the Si layer is selectively grown over the source/drain feature 151, 152 and the gate stack 120, as described with respect to FIG. 1F.

At an operation 280, a metal silicide layer is formed using Si atoms of the Si layer and metal atoms of a meal layer. For example, the metal silicide layer 190 is formed using Si atoms of the Si layer 180 and metal atoms of the meal layer 185, as described with respect to FIG. 1G.

The method described herein in accordance with some embodiments is useful for manufacturing semiconductor devices using technology nodes at 40 nm and below. The method described herein in accordance with some embodiments is also useful for manufacturing semiconductor devices using technology nodes above 40 nm.

The above method embodiment shows exemplary operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

In a method of manufacturing a semiconductor device in accordance with some embodiments, a source/drain feature is formed over a substrate. A Si-containing layer is formed over the source/drain feature. A metal layer is formed over the Si-containing layer. A metal silicide layer is formed from the metal layer and Si in the Si-containing layer.

In a method of manufacturing a semiconductor device in accordance with some embodiments, an isolation feature is formed in a substrate. A source/drain feature is formed over the substrate. The source/drain feature comprises opposite first and second sides. The first side contacts the isolation feature. The source/drain feature has a greater thickness at the second side than at the first side. A Si layer is formed over the source/drain feature. The Si layer is slanted downwardly from the second side to the first side. A metal layer is formed over the Si layer. A metal silicide layer is formed from the metal layer and the Si layer.

In a method of manufacturing a semiconductor device in accordance with some embodiments, a SiGe source/drain feature is formed over a Si-containing substrate. A stress memorization technology (SMT) layer is formed over the substrate to provide the SiGe source/drain feature with a predetermined stress. The SMT layer is removed. A resist protection oxide (RPO) layer is formed over the substrate to expose the SiGe source/drain feature. A Si layer is formed over the exposed SiGe source/drain feature. A metal layer is formed over the Si layer. A metal silicide layer is formed from the metal layer and the Si layer.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of manufacturing a semiconductor device, said method comprising:
   forming a source/drain feature in a substrate, the source/drain feature comprising an upper portion and a lower portion, the upper portion having a lower concentration of Ge than the lower portion;
   forming a Si-containing layer over the source/drain feature;
   forming a metal layer over the Si-containing layer; and
   forming a metal silicide layer from the metal layer and Si in the Si-containing layer.

2. The method of claim 1, wherein the Si-containing layer comprises a Si layer grown over the source/drain feature.

3. The method of claim 1, wherein the Si-containing layer has a thickness from 10 to 20 nm.

4. The method of claim 1, wherein said forming the source/drain feature comprises:
   forming a recess in the substrate; and
   depositing the source/drain feature in the recess.

5. The method of claim 4, wherein said depositing comprises epitaxially growing the source/drain feature to fill the recess.

6. The method of claim 1, wherein the source/drain feature comprises at least one selected from the group consisting of SiGe, GeSn, and SiGeSn.

7. A method of manufacturing a semiconductor device, said method comprising:
   forming an isolation feature in a substrate;
   forming a source/drain feature in the substrate, the source/drain feature including opposite first and second sides, the first side contacting the isolation feature, the source/drain feature having a greater thickness at the second side than at the first side;
   forming a Si layer over the source/drain feature, the Si layer sloping downwardly from the second side to the first side;
   forming a metal layer over the Si layer; and
   forming a metal silicide layer from the metal layer and the Si layer.

8. The method of claim 7, wherein the Si layer has a thickness sufficient to prevent a piping defect from occurring at the second side of the source/drain feature.

9. The method of claim 7, wherein
   the substrate contains Si; and
   the Si layer has a thickness sufficient to prevent metal atoms in the metal layer from penetrating an upper portion of the source/drain feature on the second side to react with Si atoms in the substrate.

10. The method of claim 7, wherein the Si layer has a thickness from 10 to 20 nm.

11. The method of claim 7, wherein said forming the Si layer comprises selectively growing the Si layer over the source/drain feature.

12. The method of claim 11, wherein said growing the Si layer comprises low pressure chemical vapor deposition (LPCVD).

13. The method of claim 7, wherein the source/drain feature comprises at least one selected from the group consisting of SiGe, SiC, GeSn, and SiGeSn.

14. A method of manufacturing a semiconductor device, said method comprising:
   forming a SiGe source/drain feature in a Si-containing substrate;
   forming a stress memorization technology (SMT) layer over the substrate to provide the SiGe source/drain feature with a predetermined stress;
   removing the SMT layer;
   forming a resist protection oxide (RPO) layer over the substrate to expose the SiGe source/drain feature;
   forming a Si layer over the exposed SiGe source/drain feature;
   forming a metal layer over the Si layer; and
   forming a metal silicide layer from the metal layer and the Si layer.

15. The method of claim 14, wherein
   the SiGe source/drain feature comprises a lower portion and an upper portion;
   the lower portion has a higher concentration of Ge than the upper portion;
   the upper portion is at least partially removed during at least one of said forming the SMT layer, said removing the SMT layer, or said forming the RPO layer; and
   the Si layer is formed over the SiGe source/drain feature having the at least partially removed upper portion to prevent atoms in the metal layer from penetrating the SiGe source/drain feature to react with Si atoms in the substrate.

16. The method of claim 14, wherein the Si layer has a thickness from 10 to 20 nm.

17. The method of claim 14, wherein said forming the Si layer comprises selectively growing the Si layer over the SiGe source/drain feature by low pressure chemical vapor deposition (LPCVD).

18. The method of claim 14, further comprising:
   forming a gate stack over the substrate; and
   forming an isolation feature in the substrate;
   wherein
   the SiGe source/drain feature is located between the gate stack and the isolation feature;
   the SiGe source/drain feature comprises opposite first and second sides, the first side contacting the isolation feature, the second side adjacent the gate stack;
   the SiGe source/drain feature has a greater thickness at the second side than at the first side;
   the Si layer is slanted downwardly from the second side to the first side; and
   the Si layer has a thickness sufficient to prevent metal atoms in the metal layer from penetrating an upper portion of the SiGe source/drain feature on the second side to react with Si atoms in the substrate adjacent the gate stack.

19. The method of claim 18, wherein the Si layer, the metal layer and the metal silicide layer are sequentially formed over a top portion of the gate stack.

20. The method of claim 14, further comprising:
   forming dummy spacers on sidewalls of the gate stack before said forming the SiGe source/drain feature;
   removing the dummy spacers after said forming the SiGe source/drain feature; and
   forming a liner on the sidewalls of the gate stack after said removing the dummy spacers and before said forming the SMT layer.

* * * * *